(12) United States Patent
Ahn et al.

(10) Patent No.: US 7,985,995 B2
(45) Date of Patent: Jul. 26, 2011

(54) ZR-SUBSTITUTED BATIO$_3$ FILMS

(75) Inventors: Kie Y. Ahn, Chappaqua, NY (US);
Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 883 days.

(21) Appl. No.: 11/498,559

(22) Filed: Aug. 3, 2006

(65) Prior Publication Data

US 2008/0032424 A1    Feb. 7, 2008

(51) Int. Cl.
*H01L 21/108* (2006.01)
*H01L 29/94* (2006.01)

(52) U.S. Cl. .......... 257/296; 257/E27.104; 257/E29.272

(58) Field of Classification Search .............. 257/296
See application file for complete search history.

(56) References Cited

U.S. PATENT DOCUMENTS

| | | | | |
|---|---|---|---|---|
| 5,032,559 | A * | 7/1991 | McSweeney et al. | 501/137 |
| 5,672,378 | A * | 9/1997 | Maher et al. | 264/615 |
| 6,005,274 | A | 12/1999 | Gardner et al. | |
| 6,188,100 | B1 * | 2/2001 | Hermes | 257/309 |
| 6,495,436 | B2 | 12/2002 | Ahn et al. | |
| 6,514,828 | B2 | 2/2003 | Ahn et al. | |
| 6,534,420 | B2 | 3/2003 | Ahn et al. | |
| 6,767,795 | B2 | 7/2004 | Ahn et al. | |
| 6,844,203 | B2 | 1/2005 | Ahn et al. | |
| 6,893,984 | B2 | 5/2005 | Ahn et al. | |
| 6,900,122 | B2 | 5/2005 | Ahn et al. | |
| 6,921,702 | B2 | 7/2005 | Ahn et al. | |
| 6,953,730 | B2 | 10/2005 | Ahn et al. | |
| 6,958,302 | B2 | 10/2005 | Ahn et al. | |
| 6,960,538 | B2 | 11/2005 | Ahn et al. | |
| 6,989,573 | B2 | 1/2006 | Ahn et al. | |
| 6,999,297 | B1 * | 2/2006 | Klee et al. | 361/303 |
| 2001/0055192 | A1 * | 12/2001 | Nakano et al. | 361/306.3 |
| 2002/0145845 | A1 * | 10/2002 | Hunt et al. | 361/303 |
| 2002/0192974 | A1 | 12/2002 | Ahn et al. | |
| 2003/0043637 | A1 | 3/2003 | Forbes et al. | |
| 2003/0045078 | A1 | 3/2003 | Ahn et al. | |
| 2003/0160329 | A1 | 8/2003 | Lee et al. | |
| 2003/0207032 | A1 | 11/2003 | Ahn et al. | |

(Continued)

OTHER PUBLICATIONS

Highly insulative barium zirconate-titanate thin films prepared by rf magnetron sputtering for dynamic random access memory applications, T. B. Wu, C. M. Wu, and M. L. Chen, Appl. Phys. Lett., vol. 69, No. 18, Oct. 28, 1996, pp. 2659-2661.*

(Continued)

*Primary Examiner* — Kiesha R Bryant
*Assistant Examiner* — Igwe U Anya
(74) *Attorney, Agent, or Firm* — Schwegman, Lundberg & Woessner, P.A.

(57) ABSTRACT

The use of atomic layer deposition (ALD) to form a zirconium substituted layer of barium titanium oxide (BaTiO$_3$), produces a reliable ferroelectric structure for use in a variety of electronic devices such as a dielectric in nonvolatile random access memories (NVRAM), tunable dielectrics for multi layer ceramic capacitors (MLCC), infrared sensors and electro-optic modulators. The structure is formed by depositing alternating layers of barium titanate and barium zirconate by ALD on a substrate surface using precursor chemicals, and repeating to form a sequentially deposited interleaved structure of desired thickness and composition. Such a layer may be used as the gate insulator of a MOSFET, or as a capacitor dielectric. The properties of the dielectric may be tuned by adjusting the percentage of zirconium to titanium to optimize properties such as a dielectric constant, Curie point, film polarization, ferroelectric property and a desired relaxor response.

18 Claims, 4 Drawing Sheets

U.S. PATENT DOCUMENTS

| | | | |
|---|---|---|---|
| 2003/0207540 A1 | 11/2003 | Ahn et al. | |
| 2003/0227033 A1 | 12/2003 | Ahn et al. | |
| 2003/0228747 A1 | 12/2003 | Ahn et al. | |
| 2004/0043541 A1 | 3/2004 | Ahn et al. | |
| 2004/0043569 A1 | 3/2004 | Ahn et al. | |
| 2004/0110348 A1 | 6/2004 | Ahn et al. | |
| 2004/0110391 A1 | 6/2004 | Ahn et al. | |
| 2004/0144980 A1 | 7/2004 | Ahn et al. | |
| 2004/0175882 A1 | 9/2004 | Ahn et al. | |
| 2004/0214399 A1 | 10/2004 | Ahn et al. | |
| 2004/0262700 A1 | 12/2004 | Ahn et al. | |
| 2005/0020017 A1 | 1/2005 | Ahn et al. | |
| 2005/0054165 A1 | 3/2005 | Ahn et al. | |
| 2005/0285226 A1 | 12/2005 | Lee | |
| 2006/0024975 A1 | 2/2006 | Ahn et al. | |
| 2006/0060857 A1* | 3/2006 | Mardilovich et al. | 257/66 |
| 2007/0035030 A1* | 2/2007 | Horton et al. | 257/773 |
| 2007/0131142 A1* | 6/2007 | Borland et al. | 106/287.19 |

OTHER PUBLICATIONS

Borland et al., Barium Titanate Thin Films with Titanium Partially Substituted by Zirconium, Tin or Hafnium, Oct. 21, 2005. Provisinal Application.*

Ahn, Kie Y., "ALD of Amorphous Lanthanide Doped Tiox Films", U.S. Appl. No. 11/092,072, filed Mar. 29, 2005.

Ahn, Kie Y., "Atomic Layer Deposited Hafnium Tantalum Oxide Dielectrics", U.S. Appl. No. 11/029,757, filed Jan. 5, 2005.

Ahn, Kie Y., "Atomic Layer Deposited Lanthanum Aluminum Oxide Dielectric Layer", U.S. Appl. No. 10/930,167, filed Aug. 31, 2004.

Ahn, Kie Y., "Atomic Layer Deposited Lanthanum Hafnium Oxide Dielectrics", U.S. Appl. No. 11/010,529, filed Dec. 13, 2004

Ahn, Kie Y., "Atomic Layer Deposited Titanium Aluminum Oxide Films", U.S. Appl. No. 10/931 533, filed Aug. 31, 2004.

Ahn, Kie Y., "Atomic Layer Deposited Titanium Silicon Oxide Films", U.S. Appl. No. 11/093,104, filed Mar. 29, 2005.

Ahn, Kie Y., "Atomic Layer Deposited Zirconium Silicon Oxide Films", U.S. Appl. No. 11/117,121, filed Apr. 28, 2005.

Ahn, Kie Y., "Atomic Layer Deposition of a Ruthenium Layer to a Lanthanide Oxide Dielectric Layer", U.S. Appl. No. 11/117,125; filed Apr. 28, 2005.

Ahn, Kie Y., "Atomic Layer Deposition of CEO2/AL2O3 Films as Gate Dielectrics", U.S. Appl. No. 11/055,380, filed Feb. 10, 2005.

Ahn, Kie Y., "Atomic Layer Deposition of DY-Doped HFO2 Films as Gate Dielectrics", U.S. Appl. No. 11/053,577; filed Feb. 8, 2005, 04-1179.

Ahn, Kie Y., "Atomic Layer Deposition of GDSCO3 Films as Gate Dielectrics", U.S. Appl. No. 11/215,507, filed Aug. 30, 2005.

Ahn, Kie Y., "Atomic Layer Deposition of Hf3N4/HfO2 Films as Gate Dielectrics", U.S. Appl. No. 11/063,717, filed Feb. 23, 2005.

Ahn, Kie Y., "Atomic Layer Deposition of Zr3N4/ZrO2 Films as Gate Dielectrics", U.S. Appl. No. 11/058,563, filed Feb. 15, 2005.

Ahn, Kie Y., "Atomic Layer Deposition of ZRX HFY SN1-X-Y O2 Films as High K Gate Dielectrics", U.S. Appl. No. 11/215,530, filed Aug. 29, 2005.

Ahn, Kie Y., "Cobalt Titanium Oxide Dielectric Films", U.S. Appl. No. 11/216,958, filed Aug. 31, 2005.

Ahn, Kie Y., "Gallium Lanthanide Oxide Films", U.S. Appl. No. 11/329,025.

Ahn, Kie Y., "Hafnium Tantalum Titanium Oxide Films", U.S. Appl. No. 11/297,741, filed Dec. 8, 2005.

Ahn, Kie Y., "Hafnium Titanium Oxide Films", U.S. Appl. No. 11/140,643, filed May 27, 2005.

Ahn, Kie Y., "Hybrid ALD-CVD of PrXOY/ZrO2 Films as Gate Dielectrics", U.S. Appl. No. 11/010,766, filed Dec. 13, 2004.

Ahn, Kie Y., "Iridium / Zirconium Oxide Structure", U.S. Appl. No. 11/152,759, filed Jun. 14 2005.

Ahn, Kie Y., "Lanthanide Yttrium Aluminum Oxide Dielectric Films", U.S. Appl. No. 11/297,567, filed Dec. 8, 2005.

Ahn, Kie Y., "Lanthanum Aluminum Oxynitride Dielectric Films", U.S. Appl. No. 11/216,474, filed Aug. 31, 2005.

Ahn, Kie Y., "Magnesium Titanium Oxide Films", U.S. Appl. No. 11/189,075, filed Jul. 25, 2005.

Ahn, Kie Y., "Ruthenium Gate for a Lanthanide Oxide Dielectric Layer", U.S. Appl. No. 10/926,812, filed Aug. 26, 2004.

Ahn, Kie Y., "Zirconium-Doped Gadolinium Oxide Films", U.S. Appl. No. 11/215,578, filed Aug. 29, 2005.

Carroll, K R., et al., "Microwave measurement of the dielectric constant of SrOm5 ferroelectric thin films", *Applied Physics Letters* (1993).

Endo, Kazuhiko , "Metal Organic Atomic Layer Deposition of High-k Gate Dielectrics Using Plasma Oxidation", *Japanese Journal of Applied Physics*, 42, (2003),L685-L687.

Farhi, R , "A Raman and dielectric study of ferroelecric Ba(Ti1-xZrx)03 ceramics" *The European Physics Journal*, B 9, (1999),599-604.

Gui, Jianian , et al., "The effect ofi Zr on the microstructure of Ba(Ti1_yZry) O3 thin films prepared by chemical-solution deposition", *Materials Letters*, 35, (1998),275-379.

Gust, M C., et al., "Crystallization of Sol Gel-Derived Barium Strontium Titanate Thin Films", *Journal of the American Ceramic Society*, 84 (5), (2001),1087-1092.

Halder, S , et al., "Fabrication and electrical characterisation of Zr-substituted BaTiO 3 thin films", *Applied Physics A* 81, (2005),25-29.

Hennings, D , et al., "Diffuse ferroelectric phase transitions in Ba (Ti 1-y Zry) O3 ceramics", *Journal of the American Ceramic Society*, (1992),539 -.

Ishii, Hiroyuki , "Growth and electrical properties of atomic-layer deposited ZrO2/Si-nitride stack gate dielectrics", *Journal of Applied Physics*, 95(2), (Jan. 15, 2004),536-542.

Jonsson, A. K., "Dielectric Permittivity and Intercalation Parameters of Li Ion Intercalated Atomic Layer Deposited ZrO2", *Journal of the Electrochemical Society*, vol. 151 ,No. 3, (2004), F54-F58.

Leskela, M , "ALD precursor chemistry: Evolution and future challenges", *Journal de Physique IV (Proceedings)* 9(8) (Sep. 1999),837-852.

Nomura, Shoichiro , et al., "Recent Applications of PMN-Based Electrostrictors", *Ferroelectrics*, 50 (1983),197-202.

Pennebaker, W P., et al., "RF Sputtered Strontium Titanate Films", *IBM Journal of Research and Development*,13 (6), (1969),695.

Persev, N. A., et al., "Ferroelectric thin films grown on tensile substrates: Renormalization of the Curie A Weiss law and apparent absence of ferroelectricity", *Journal of Applied Physics*, 85 (3), (Feb. 1999),1698-1701.

Ravez, Jean , et al., "Lead-free ferroelectric relaxor ceramics in the BaTiO 3-BaZrO 3-CaTiO 3 system", *Journal of Materials Chemistry*, 9 (7), (Apr. 1999),1609-1613.

Schwartz, Robert W., et al., "Chemical solution deposition of electronic oxide films", *Comptes rendus Chimie* ISSN : 1631-0748 2004 ,433-61.

Sneh, Ofer , "Thin film atomic layer deposition equipment for semiconductor processing", *Thin Solid Films* 402 1-2 2002 ,248-261.

Suntola, T. , "Atomic Layer Epitaxy", *Handbook of Crystal Growth, 3; Thin Films of Epitaxy, Part B: Growth Mechanics and Dynamics*, Amsterdam,(1994),601-663.

Suntola, Tuomo , "Atomic layer epitaxy", *Thin Solid Films*, 216(1), (Aug. 28, 1992),84-89.

Vehkamaki, Marko , "Growth of SrTiO3 and BaTiO3 Thin Films by Atomic Layer Deposition", *Electrochemical and Solid-State Letters*, vol. 2, No. 10, (Oct. 1999),504-506.

Waser, Rainer , et al., "Advanced Chemical Deposition Techniques-From Research to Production", *Integrated Ferroelectrics* (36), (2001),3-20.

Wilk, G. D., "High-K gate dielectrics: Current status and materials properties considerations", *Journal of Applied Physics*, 89(10), (May 2001),5243-5275.

Youm, Minsoo , "Metal Oxide Semiconductor Field Effect Transistor Characteristics with Iridium Gate Electrode on Atomic Layer Deposited ZrO2 High-k Dielectrics", *Jpn. J. Appl. Phys.*, vol. 42, (Aug. 2003),5010-5013.

"International Application No. PCT/US2007/016801 Search Report", 8 pgs.

"International Application No. PCT/US2007/016801 Written Opinion", 10 pgs.

Choi, W. S., et al., "Characterization of Ba(Zr0.2Ti0.8)O3 thin films deposited by RF-magnetron sputtering", *Journal of crystal growth*, elsevier, Amsterdam, NL, vol. 237-239, ISSN: 0022-0248,(Apr. 2002),438-442 pgs.

Tohma, T., et al., "Dielectric properties of BA(TI0.85ZR0.15)O3 film prepared by metalorganic chemical vapor deposition", *Japanese journal of applied physics, Japan society of applied physics*, Tokyo, JP, vol. 42, No. 11, Part 1, ISSN: 0021-4922,(Nov. 2003),6969-6972 pgs.

Wu, T. B., et al., "Highly Insulative Barium Zirconate-Titanate Thin Films Prepared by RF Magnetron Sputtering for Dynamic Random Access Memory Applications", *Applied Physics Letters, AIP, A,erican Institute of Physics*, Melville, NY, US, vol. 69 No. 18, ISSN: 0003-6951,(Oct. 28, 1996),2659-2661 pgs.

\* cited by examiner

US 7,985,995 B2

ZR-SUBSTITUTED BATIO₃ FILMS

TECHNICAL FIELD

This application relates generally to semiconductor devices and device fabrication and, more particularly to dielectric layers, their method of fabrication, and ferroelectric properties.

BACKGROUND

The semiconductor device industry has a continuous market driven need to reduce the size of devices such as transistors. Smaller transistors result in improved operational speed and clock rate, and reduced power requirements in both standby and operational modes. To reduce transistor size, the thickness of the silicon dioxide ($SiO_2$) gate dielectric is reduced in proportion to the shrinkage of the gate length. For example, a metal-oxide-semiconductor field effect transistor (MOSFET) might use a 1.5 nm thick $SiO_2$ gate dielectric for a gate length of less than 100 nm. Such physically thin gate dielectrics may be a potential reliability issue with gate leakage and breakdown problems in upcoming generations of smaller MOSFETs. Small, low power consuming, and more reliable integrated circuits (ICs) will likely be used in products such as processors, mobile telephones, and memory devices such as dynamic random access memories (DRAMs).

The semiconductor industry relies on the ability to scale the dimensions of its basic devices, such as the MOSFET, to achieve improved operational speed and power consumption. Device scaling includes scaling the gate dielectric, which has primarily been silicon dioxide ($SiO_2$). A thermally grown amorphous $SiO_2$ layer provides an electrically and thermodynamically stable material, where the interface of the $SiO_2$ layer with underlying silicon provides a high quality interface with superior electrical isolation. However, increased scaling and other requirements in microelectronic devices have created reliability issues as the gate dielectric has become thinner. It has been proposed to form a gate dielectric by the use of materials with higher dielectric constants (k).

The semiconductor memory industry has a need for non volatile memory elements that do not lose the stored information in the memory when power is shut down. One method includes forming electrically floating gates between a control gate and the substrate. However, the need to form multiple levels of gate electrodes increases the cost of manufacture, and the electrically floating gates must be charged and discharged by means of tunneling currents and avalanche currents, which may be slow, require high programming voltages, and may have reliability problems. It has been proposed to use a dielectric material for the gate insulator that is affected by impressed signals.

DETAILED DESCRIPTION

Figure 1:
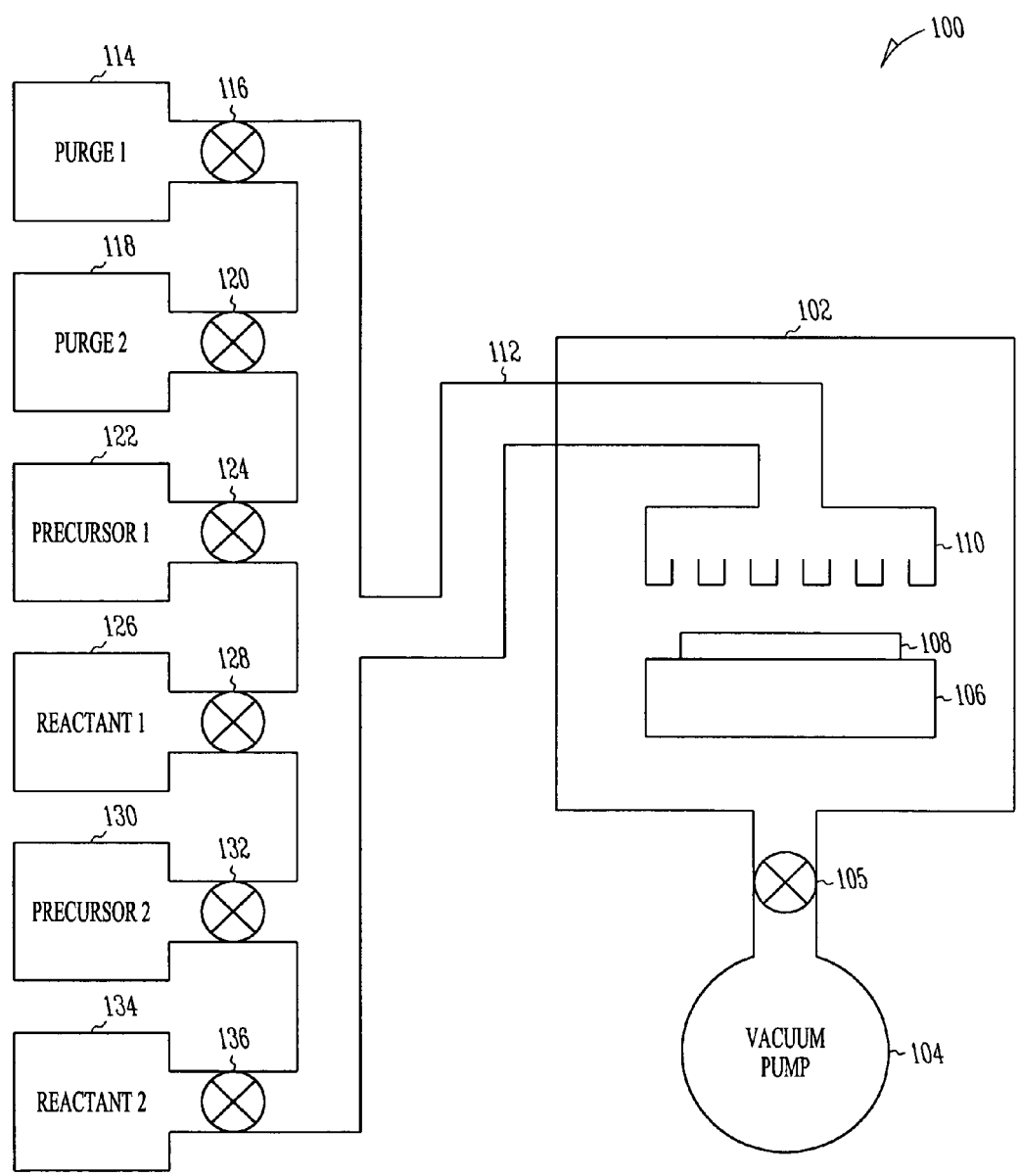
FIG. 1 depicts an atomic layer deposition system for fabricating a dielectric layer formed as a series of interleaved oxide layers.

The following detailed description refers to the accompanying drawings that show, by way of illustration, specific aspects and embodiments in which the present invention may be practiced. These embodiments are described in sufficient detail to enable those skilled in the art to practice the described embodiments. Other embodiments may be utilized and structural, logical, and electrical changes may be made without departing from the scope of the present invention. The various embodiments are not necessarily mutually exclusive, as some embodiments can be combined with one or more other embodiments to form new embodiments.

The terms "wafer" and "substrate" used in the following description include any structure having an exposed surface with which to form an integrated circuit (IC) structure. The term "substrate" is understood to include semiconductor wafers. The term "substrate" is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term "conductor" is understood to generally include n-type and p-type semiconductors. The term "insulator" or "dielectric" is defined to include any material that is less electrically conductive than the materials referred to as conductors or as semiconductors. Dielectric is defined to include insulators that have properties that may be commonly known as ferroelectric, high dielectric constant (k), electrostrictive or relaxor.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Improved gate dielectric films, as discussed herein, may include at least one of increasing the dielectric constant of the gate insulator material over the 3.9 value of silicon dioxide, and the use of a ferroelectric material to provide a non volatile memory cell with a single gate electrode.

First, a general discussion on the use of high dielectric constant (i.e., high k) materials will be given. A gate dielectric in a metal oxide semiconductor (MOS) transistor has both a physical gate dielectric thickness and an equivalent oxide thickness ($t_{eq}$). The equivalent oxide thickness quantifies the electrical properties, such as capacitance, of the gate dielectric in terms of a representative physical thickness. $t_{eq}$ is defined as the thickness of a theoretical silicon dioxide ($SiO_2$) layer that would have the same capacitance density as a given dielectric, ignoring leakage current and reliability considerations.

A SiO$_2$ layer of thickness, t, deposited on a Si surface as a gate dielectric will have a t$_{eq}$ larger than its physical thickness, t. This t$_{eq}$ results from the capacitance in the surface channel on which the SiO$_2$ is deposited due to the formation of a depletion/inversion region. This depletion/inversion region can result in t$_{eq}$ being from 3 to 6 Angstroms (Å) larger than the SiO$_2$ thickness, t. Thus, with the semiconductor industry driving to scale the gate dielectric equivalent oxide thickness to under 10 Å, the physical thickness requirement for a SiO$_2$ layer used for a gate dielectric would need to be approximately 4 to 7 Å.

Additional requirements for a SiO$_2$ layer would depend on the gate electrode used in conjunction with the SiO$_2$ gate dielectric. Using a conventional polysilicon gate would result in an additional undesirable increase in t$_{eq}$ for the SiO$_2$ layer. This additional thickness could be eliminated by using a metal gate electrode, though metal gates are not currently used in typical complementary metal-oxide-semiconductor field effect transistor (CMOS) technology. These two effects require devices designed with a physical SiO$_2$ gate dielectric layer of about 4 Å or less.

Silicon dioxide is used as a gate dielectric, in part, due to its electrical isolation properties in a SiO$_2$—Si based structure. This electrical isolation is due to the relatively large band gap of SiO$_2$ (8.9 eV), which makes it a good insulator. Significant reductions in its band gap would eliminate a material for use as a gate dielectric. However, as the thickness of a SiO$_2$ layer decreases, the number of atomic layers, or monolayers of the material in the thickness decreases. At a certain thickness, the number of monolayers will be sufficiently small that the SiO$_2$ layer will not have a complete arrangement of atoms as found in a thicker, or bulk layer. As a result of incomplete formation relative to a bulk structure, a thin SiO$_2$ layer of only one or two monolayers will not form a full band gap. The lack of a full band gap in a SiO$_2$ gate dielectric may cause an effective short between an underlying conductive silicon channel and an overlying polysilicon gate. This undesirable property sets a limit on the physical thickness to which a SiO$_2$ layer can be scaled. The minimum thickness due to this monolayer effect is thought to be about 7-8 Å. Therefore, for future devices to have a t$_{eq}$ less than about 10 Å, other dielectrics than SiO$_2$ need to be considered for use as a gate dielectric.

For a typical dielectric layer used as a gate dielectric, the capacitance is determined as in a parallel plate capacitance: C=k∈$_0$A/t, where k is the dielectric constant, ∈$_0$ is the permittivity of free space, A is the area of the capacitor, and t is the thickness of the dielectric. The thickness, t, of a material is related to its t$_{eq}$ for a given capacitance, with SiO$_2$ having a dielectric constant k$_{ox}$=3.9, as $$t=(k/k_{ox})t_{eq}=(k/3.9)t_{eq}.$$

Thus, materials with a dielectric constant greater than that of SiO$_2$ will have a physical thickness that can be considerably larger than a desired t$_{eq}$, while providing the desired equivalent oxide thickness. For example, an alternate dielectric material with a dielectric constant of 10 could have a thickness of about 25.6 Å to provide a t$_{eq}$ of 10 Å, not including any depletion/inversion layer effects. Thus, a reduced equivalent oxide thickness for transistors can be realized by using dielectric materials with higher dielectric constants than SiO$_2$.

The thinner equivalent oxide thickness required for lower transistor operating voltages and smaller transistor dimensions may be found in many materials, but typical fabricating requirements makes replacing SiO$_2$ difficult. The microelectronics industry still uses silicon-based devices, which requires that the gate dielectric be grown on a silicon substrate. During the formation of the dielectric on the silicon layer, there exists the possibility that a small layer of SiO$_2$ could be formed in addition to the desired dielectric due to high temperature processing. The result would effectively be a dielectric layer consisting of two sub-layers in parallel with each other and with the silicon layer on which the dielectric is formed. The resulting overall capacitance would be that of two dielectrics in series. The t$_{eq}$ of the dielectric layer is the sum of the SiO$_2$ thickness and a multiplicative factor of the thickness, t, of the dielectric being formed with a dielectric constant of k, written as $$t_{eq}=t_{SiO_2}+(k_{ox}/k)t.$$

Thus, if a SiO$_2$ layer is unintentionally formed during the gate insulator process, the t$_{eq}$ is again limited by a relatively low dielectric constant SiO$_2$ layer. In the event that a barrier layer is formed between the silicon layer and the gate dielectric in which the barrier layer prevents the formation of a SiO$_2$ layer, the t$_{eq}$ would be limited by the layer with the lowest dielectric constant. However, whether a single dielectric layer with a high dielectric constant or a barrier layer with a higher dielectric constant than SiO$_2$ is employed, the layer directly in contact, or interfacing with the silicon layer must provide a high quality interface to maintain high channel carrier mobility. Preventing the formation of an undesirable SiO$_2$ layer is one advantage of using lower temperatures in an atomic layer deposition (ALD) process.

One of the advantages of using SiO$_2$ as a gate dielectric has been that the formation of the SiO$_2$ layer results in an amorphous gate dielectric. Having an amorphous structure for a gate dielectric provides reduced leakage current associated with grain boundaries in polycrystalline gate dielectrics, which may cause high leakage paths. Additionally, grain size and orientation changes throughout a polycrystalline gate dielectric may cause variations in the film's dielectric constant, along with uniformity and surface topography issues. Typically, materials having the advantage of a high dielectric constant relative to SiO$_2$ also have the disadvantage of a crystalline form, at least in a bulk configuration. The best candidates for replacing SiO$_2$ as a gate dielectric are those with high dielectric constant, which can be fabricated as a thin layer with an amorphous form. The amorphous nature of the film is another advantage of using lower temperatures in the ALD deposition process.

Another consideration for selecting the material and method for forming a dielectric film concerns the roughness of a dielectric film on a substrate. Surface roughness of the dielectric film has a significant effect on the electrical properties of the gate oxide, and the resulting operating characteristics of the transistor. The leakage current through a physical 1.0 nm gate dielectric may increase by a factor of 10 for every 0.1 increase in the root-mean-square (RMS) roughness of the dielectric layer. This is another advantage of using ALD processes that provide smooth surfaces compared to other deposition methods.

During a conventional sputtering deposition process, particles of the material to be deposited bombard the substrate surface at a high energy. When a particle hits the surface, some particles adhere, and other particles may cause damage. High energy impacts may create pits. The surface of a sputtered layer may be rough due to the rough interface at the substrate.

A dielectric film formed using atomic layer deposition (ALD) will have a substantially smooth surface relative to other processing techniques, can provide for controlling transitions between material layers, and have tight control of thickness and uniformity. As a result of such control, atomic layer deposited dielectric film may have an engineered transition with a substrate surface, or may be formed with many thin layers of different dielectric materials to enable selection of the dielectric constant and other material properties to a value between that available from pure dielectric compounds.

Secondly, a general discussion of atomic layer deposition (ALD) will be given to describe how the use of ALD improves the dielectric properties discussed above and improves manufacturability and process control. ALD, which may also be known as atomic layer epitaxy (ALE), is a modification of chemical vapor deposition (CVD) and may also be called "alternatively pulsed-CVD." In ALD, gaseous precursors are introduced one at a time to the substrate surface mounted within a reaction chamber (or reactor). This introduction of the gaseous precursors takes the form of sequential pulses of each gaseous precursor. In a pulse of a precursor gas, the precursor gas is made to flow into a specific area or region for a short period of time. Between the pulses, the reaction chamber is purged with a gas, which in many cases is an inert gas, and/or evacuated.

In the first reaction step of the ALD process the first precursor saturates and is chemisorbed at the substrate surface, during the first pulsing phase. Subsequent pulsing with a purging gas removes excess precursor from the reaction chamber, specifically the precursor that has not been chemisorbed.

The second pulsing phase introduces a second precursor to the substrate where the growth reaction of the desired film takes place, with a reaction thickness that depends upon the amount of the chemisorbed first precursor. Subsequent to the film growth reaction, reaction byproducts and precursor excess are purged from the reaction chamber. With a precursor chemistry where the precursors adsorb and aggressively react with each other on the substrate, one ALD cycle can be performed in less than one second in properly designed flow type reaction chambers. Typically, precursor pulse times range from about 0.5 sec to about 2 to 3 seconds.

In ALD processes, the saturation of all the reaction and purging phases makes the film growth self-limiting, which results in large area uniformity and conformality. ALD provides for controlling film thickness in a straightforward manner by controlling the number of growth cycles.

The precursors used in an ALD process may be gaseous, liquid or solid. However, liquid or solid precursors should be volatile with high vapor pressures or low sublimation temperatures. The vapor pressure should be high enough for effective mass transportation. In addition, solid and some liquid precursors may need to be heated inside the reaction chamber and introduced through heated tubes to the substrates. The necessary vapor pressure should be reached at a temperature below the substrate temperature to avoid condensation of the precursors on the substrate. Due to the self-limiting growth mechanisms of ALD, relatively low vapor pressure solid precursors may be used, though evaporation rates may vary somewhat during the process because of changes in surface area of the solid precursor.

Other desirable characteristics for ALD precursors include thermal stability at the substrate temperature, since decomposition may destroy surface control and accordingly the advantages of the ALD method, which relies on the reaction of the precursor at the substrate surface. A slight decomposition, if slow compared to the ALD growth, can be tolerated. The precursors should chemisorb on, or react with the surface, though the interaction between the precursor and the surface as well as the mechanism for the adsorption is different for different precursors. The molecules at the substrate surface should react aggressively with the second precursor, which may be called a reactant, to form the desired film.

Additionally, precursors should not react with the film to cause etching, and precursors should not dissolve in the film. The use of highly reactive precursors in ALD may contrast with the precursors for conventional metallo-organic CVD (MOCVD) type reactions. Further, the by-products of the reaction should be gaseous in order to allow their easy removal from the reaction chamber during a purge stage. Finally, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. The metal precursor reaction at the substrate is typically followed by an inert gas pulse (or purge) to remove excess precursor and by-products from the reaction chamber prior to an input pulse of the next precursor of the fabrication sequence.

By the use of RS-ALD processes, films can be layered in equal metered sequences that are all identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle can be realized.

The advantages of RS-ALD include continuity at an interface and avoiding poorly defined nucleating regions, which are typical for thin chemical vapor deposition (<20 Å) and physical vapor deposition (<50 Å), conformality over a variety of substrate topologies due to its layer-by-layer deposition technique, use of low temperature and mildly oxidizing processes, lack of dependence on the reaction chamber, growth thickness dependent solely on the number of cycles performed, and ability to engineer multilayer laminate films with resolution of one to two monolayers. RS-ALD processes allow for deposition control on the order of single monolayers and the ability to deposit monolayers of amorphous films.

A cycle of an ALD deposition sequence includes pulsing a precursor material, pulsing a purging gas for the precursor, pulsing a reactant precursor, and pulsing the reactant's purging gas, resulting in a very consistent deposition thickness that depends upon the amount of the first precursor that adsorbs onto, and saturates, the surface. This cycle may be repeated until the desired thickness is achieved in a single material dielectric layer, or may be alternated with pulsing a third precursor material, pulsing a purging gas for the third precursor, pulsing a fourth reactant precursor, and pulsing the reactant's purging gas. There need not be a reactant gas if the precursor can interact with the substrate directly, as in the case of a dopant metal layer on a dielectric layer, as claimed in the present subject matter. In the case where the thickness of the first series of ALD cycles results in a dielectric layer that is only a few molecular layers thick, and the second series of cycles also results in a different dielectric layer that is only a few molecular layers thick, this may be known as a nanolayer material or a nanolaminate. A nanolaminate means a composite film of ultra-thin layers of two or more different materials in a layered stack, where the layers are alternating layers of different materials having a thickness on the order of a nanometer, and may be a continuous film only a single monolayer thick of the material. The nanolayers are not limited to alternating single layers of each material, but may include having several layers of one material alternating with a single layer of the other material, to obtain a desired ratio of the two or more materials. Such an arrangement may obtain a dielectric constant that is between the values of the two or more materials singly. A nanolaminate may also include having several layers of one material formed by an ALD reaction either over or under a single layer of a different material formed by another type of reaction, such as a MOCVD reaction. The layers of different materials may remain separate after deposition, or they may react with each other to form an alloy layer. The alloy layer may be viewed as a doping layer, and the properties of the dielectric layer may be varied by such doping.

The present disclosure is on the use of the above described ALD method for forming a uniform film of zirconium substituted barium titanate. By adjusting the percentage of zirconium, the properties of the film may be varied from a ferroelectric material suitable for non volatile memories (NVRAM), to a very high dielectric contact material with high electrostrictive strains suitable for micro-mechanical devices (MEMs). The ALD layers may be formed as two different interleaved layers of barium zirconate and barium titanate, or as three different interleaved layers of titanium oxide, barium oxide and zirconium oxide, or other variations resulting in the desired composition of $Ba(Ti_{1-x}Zr_xO_3)$. The individual material layers may be high temperature annealed after deposition to form the uniform final film, or may be left in the "as deposited" state.

In an illustrative embodiment, a layer of a barium titanium oxide (which may be known as a barium titanate film) is formed on a substrate mounted in a reaction chamber using sequential atomic layer deposition, which may also be known as RS-ALD, or ALD. An embodiment includes forming the titanium oxide layers using a precursor gas such as titanium tetra-chloride, having a chemical formula of $TiCl_4$, or titanium tetraisoproxide and water vapor. The barium may be formed as a separate layer of barium oxide or as a part of the titanium oxide layer using barium bis(pentamethylcyclopentadienyl) or barium bis(triisopropylcyclopentadienyl) and water vapor. Another embodiment includes using other precursors such as a diketonate chelate precursor gas such as tetramethyl heptanedione or dipivaloylmethane, and ozone. Other solid or liquid precursors may be used in an appropriately designed reaction chamber. The use of such precursors in an ALD reaction chamber may result in lower deposition temperatures in the range of 100° C. to 350° C., more preferably 275° C. to 325° C. Purge gases may include nitrogen, helium, argon or neon. The barium titanate films formed may have good thermal and electrical properties, with a high dielectric constant k=350 to 550. Such films may survive high temperature anneals (sometimes used to reduce fixed surface state charges and improve metal to semiconductor resistance) of up to 1000° C. (more preferably 500° C.), and have low leakage currents of less than $2 \times 10^{-7}$ $A/cm^2$ at electric field strengths of one MVolt/cm.

FIG. 1 shows an embodiment of an atomic layer deposition system 100 for forming a dielectric film. The elements depicted permit those skilled in the art to practice the present embodiments without undue experimentation. In FIG. 1, a substrate 108 on a heating element/wafer holder 106 is located inside a reaction chamber 102 of ALD system 100. The heating element 106 is thermally coupled to substrate 108 to control the substrate temperature. A gas-distribution fixture 110 introduces precursor, reactant and purge gases to the substrate 108 in a uniform fashion. The gases introduced by the gas distribution fixture, sometimes referred to a showerhead, react with the substrate 108, and any excess gas and reaction products are removed from chamber 102 by vacuum pump 104 through a control valve 105. Each gas originates from individual gas sources 114, 118, 122, 126, 130, and 134, with a flow rate and time controlled by mass-flow controllers 116, 120, 124, 128, 132 and 136, respectively. Gas sources 122 and 130 provide a precursor gas either by storing the precursor as a gas or by providing for evaporating a solid or liquid material to form the selected precursor gas.

Also included in the system are purging gas sources 114 and 118, coupled to mass-flow controllers 116 and 120, respectively. The embodiment may use only one of the purge gases for all four disclosed illustrative purging steps, or both purge gases may be used simultaneously, or alternating the purge gases as required for the particular desired result. Furthermore, additional purging gas sources can be constructed in ALD system 100, one purging gas source for each different precursor and reactant gas, for example. For a process that uses the same purging gas for multiple precursor gases, fewer purging gas sources may be required for ALD system 100. The precursor gas may be a combination of various precursors to form a combination layer. The precursor, reactant and purge gas sources are coupled by their associated mass-flow controllers to a common gas line or conduit 112, which is coupled to the gas-distribution fixture 110 inside the reaction chamber 102. Gas conduit 112 may also be coupled to another vacuum pump, or exhaust pump, to remove excess precursor gases, purging gases, and by-product gases at the end of a purging sequence from the gas conduit 112.

Vacuum pump, or exhaust pump, 104 is coupled to chamber 102 by control valve 105, which may be a mass-flow valve, to remove excess precursor gases, purging gases, and by-product gases from reaction chamber 102 at the end of a purging sequence. For convenience, control displays, mounting apparatus, temperature sensing devices, substrate maneuvering apparatus, and necessary electrical connections as are known to those skilled in the art are not shown in FIG. 1. Though ALD system 100 is well suited for practicing the present embodiments, other commercially available ALD systems may also be used.

The use and operation of reaction chambers for deposition of films are understood by those of ordinary skill in the art of semiconductor fabrication. The present embodiments may be practiced on a variety of such reaction chambers without undue experimentation. Furthermore, one of ordinary skill in the art will comprehend the necessary detection, measurement, and control techniques in the art of semiconductor fabrication upon reading the disclosure.

The elements of ALD system 100 may be controlled by a computer using a computer readable medium to control the individual elements such as pressure control, temperature control, and gas flow within ALD system 100. To focus on the use of ALD system 100 in the various described embodiments, the computer is not shown, although those skilled in the art can appreciate that system 100 can be under computer control.

Figure 2:
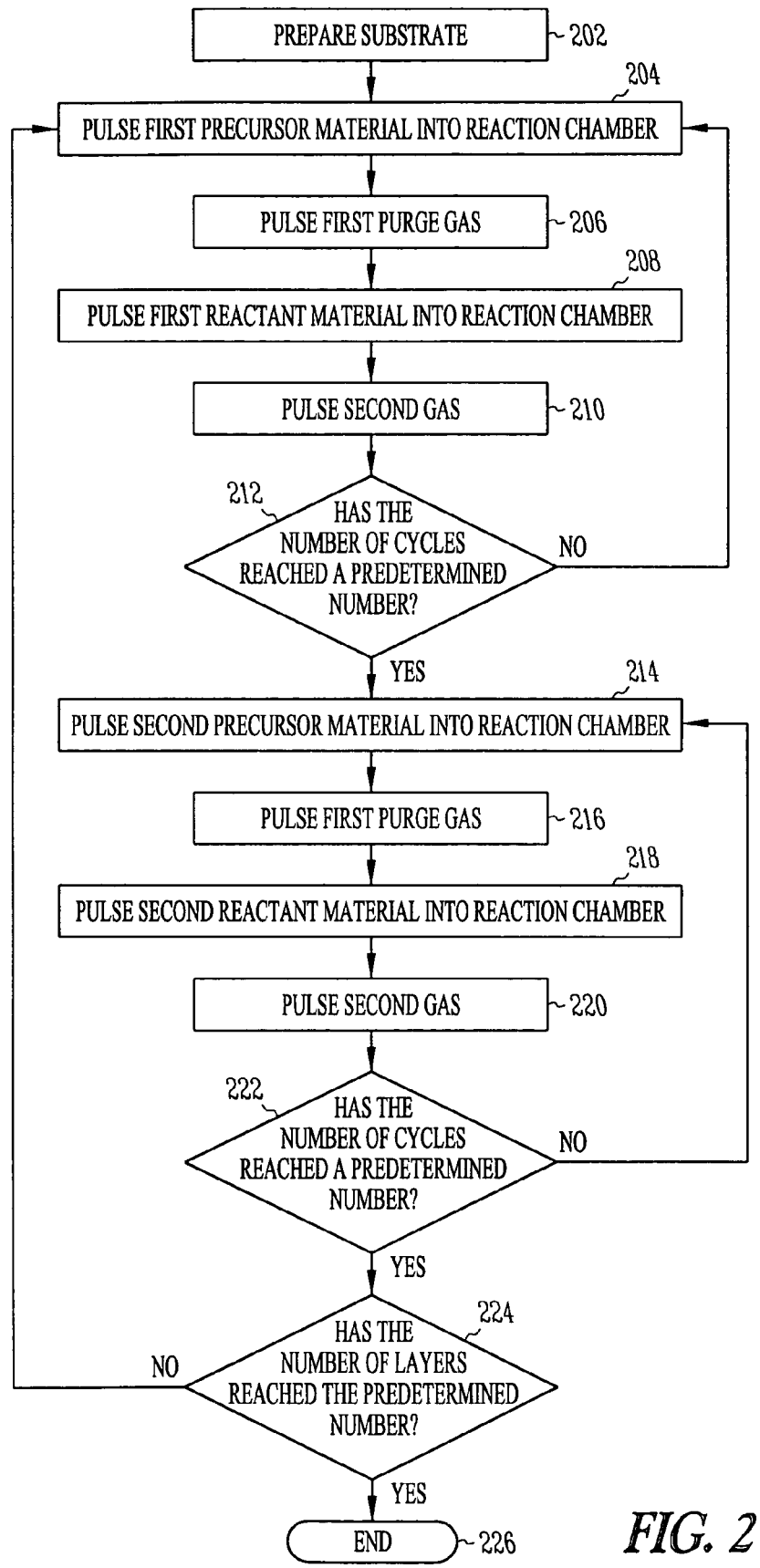
FIG. 2 illustrates a flow diagram of elements for an embodiment of a method to form a dielectric layer by atomic layer deposition according to various embodiments.

FIG. 2 illustrates a flow diagram of operational steps for an embodiment of a method to form a nanolaminate dielectric layer having an illustrative two different materials. Each of the different materials may each be a combination of materials. For illustrative example, the first layer may be a barium titanate layer, which is a combination of barium, titanium and oxygen. The second layer may be a barium zirconate layer. At 202, a substrate is prepared to react immediately with, and chemisorb the first precursor gas or combination of precursor gases. This preparation will remove contaminants such as thin organic films, dirt, and native oxide from the surface of the substrate, and may include a hydrofluoric acid rinse, or a sputter etch in the reaction chamber 102. At 204 a first precursor material, or combination of precursor materials, enters the reaction chamber for a predetermined length of time, for example 0.5-2.0 seconds. The first precursor material is chemically adsorbed onto the surface of the substrate, the amount depending upon the temperature of the substrate, in one embodiment 275° C. for titanium tetraisoproxide and barium bis(pentamethylcyclopentadienyl), and the presence of sufficient flow of the precursor materials. In addition, the pulsing of the precursor may use a period providing uniform coverage of an adsorbed monolayer on the substrate surface, or may use a period that provides partial formation of a monolayer on the substrate surface.

At 206 a first purge gas enters the reaction chamber for a predetermined length of time sufficient to remove substantially all of the non-chemisorbed first precursor materials. Typical times may be 1.0-2.0 seconds, with a purge gas comprising nitrogen, argon, neon, combinations thereof, or other gases such as hydrogen. At 208 a first reactant gas enters the chamber for a predetermined length of time, sufficient to provide enough of the reactant to chemically combine with the amount of chemisorbed first precursor material on the surface of the substrate. Typical reactant materials include mildly oxidizing materials such as water vapor, but may in general also include hydrogen peroxide, nitrogen oxides, ozone and oxygen gas, and combinations thereof. It should be noted that the difference between a precursor and a reactant is basically the timing of the introduction of the material into the reaction chamber. At 210 a second purge gas, which may be the same or different from the first purge gas, enters the chamber for a predetermined length of time, sufficient to remove substantially all non-reacted materials and any reaction byproducts from the chamber.

At 212 a decision is made as to whether or not the thickness of the first material has reached the desired thickness, or whether another deposition cycle is required of the first material. If another deposition cycle is needed, then the operation returns to 204, until the desired first layer is completed, at which time the process moves on to the deposition of the second material at 214. At 214 a second precursor material, or combination of precursor materials, enters the reaction chamber for a predetermined length of time, typically 0.5-2.0 seconds. The second precursor material is chemically adsorbed onto the surface of the substrate, in this case the top surface of the first material, the amount of absorption depending upon the temperature of the substrate, and the presence of sufficient flow of the precursor material. In addition, the pulsing of the precursor may use a period that provides uniform coverage of an adsorbed monolayer on the substrate surface, or may use a period that provides partial formation of a monolayer on the substrate.

At 216 the first purge gas is shown as entering the chamber, but the invention is not so limited. The purge gas used in the second dielectric material deposition may be the same or different from either of the two previously noted purge gases, and FIG. 1 could be shown as having more than the two purge gases illustrated. The purge cycle continues for a predetermined length of time sufficient to remove substantially all of the non-chemisorbed second precursor material.

At 218 an illustrative second reactant gas, which may be the same or different from the first reactant gas, enters the chamber for a predetermined length of time, sufficient to provide enough of the reactant to chemically combine with the amount of chemisorbed second precursor material on the surface of the substrate. In certain cases there may be no second reactant gas, and the precursor chemically reacts with the first material to form an alloy or a doped layer of the first material. At 220 another purge gas enters the chamber, which may be the same or different from any of the three previously discussed purge gases, for a predetermined length of time, sufficient to remove substantially all non-reacted materials and any reaction byproducts from the chamber.

At 222 a decision is made as to whether or not the thickness of the second material has reached the desired thickness, or whether another deposition cycle is required. If another deposition cycle is needed, then the operation returns to 214, until the desired second layer is completed. The desired thicknesses of the first and second materials in the dielectric may not be the same thickness, and there may be more deposition cycles for one material as compared to the other. The thickness of each of the first two layers may be selected to obtain a desired final composition. If the second layer has reached the desired thickness, the process moves on to a decision at 224 of whether the number of layers of the first and second materials has reached the desired number. In this illustrative embodiment a single layer of the first material and a single layer of the second material have been completed at this point in the process. If more than a single layer of each material is desired, the process moves back to another deposition of the first dielectric material at 204. After the number of interleaved layers of materials one and two has reached the desired value, the deposition ends at 226.

The embodiments described herein provide a process for growing a dielectric film having a wide range of useful ferroelectric properties and high dielectric constants and equivalent oxide thickness, $t_{eq}$, associated with a dielectric constant in the range from about 150 to about 550. This range of dielectric constants provides for a $t_{eq}$ ranging up to about 1% relative to a given silicon dioxide thickness, that is, it appears to be equivalent to a silicon dioxide layer that is 100 times thinner than the physical thickness, providing enhanced probability for reducing leakage current. Controlling the amount of zirconium in the barium titanate film to 10 to 30% results in a material having what may be known as relaxor properties and electrostrictive action. The described materials and process may be implemented to form transistors, capacitors, non volatile memory devices, micro-electro-mechanical devices (MEMs) and other electronic systems including information handling devices. The invention is not limited to two dielectric materials, and the equipment described in FIG. 1 could have included a precursor and reactant 3, 4, which are not described for simplicity, or there may be two or more simultaneous flows of different precursors during the second material deposition.

Figure 3:
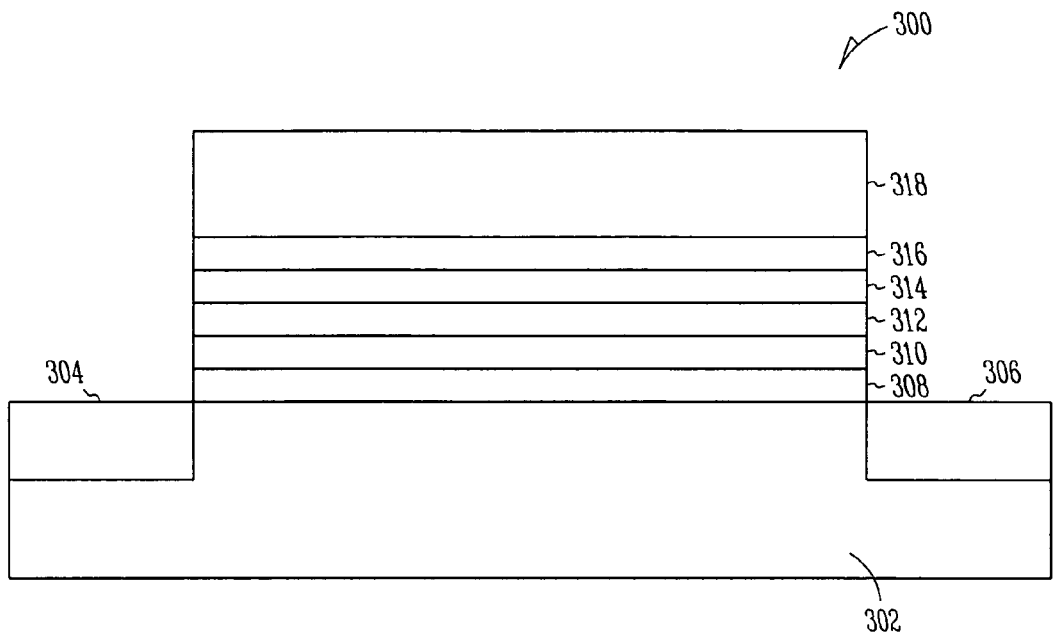
FIG. 3 illustrates an embodiment of a configuration of a transistor having an atomic layer deposited dielectric layer according to an embodiment.

FIG. 3 illustrates a single transistor 300 in an embodiment of a method to form a dielectric layer containing an ALD deposited zirconium substituted barium titanate gate oxide layer. This embodiment may be implemented with the system 100 of FIG. 1 used as an atomic layer deposition system. A substrate 302 is prepared, typically a silicon or semiconductor material. In other embodiments, germanium, gallium arsenide, silicon-on-sapphire (SOS) substrates, silicon on insulator (SOI) or other suitable substrates may also be used. The preparation process includes cleaning substrate 302 and forming various layers and regions of the substrate, such as drain diffusion 304 and source diffusion 306 of an illustrative metal oxide semiconductor (MOS) transistor 300, which may occur prior to forming a gate dielectric, or after forming the gate dielectric and gate electrode. The substrate may be cleaned to provide an initial substrate depleted of its native oxide to avoid having a situation of two capacitors in series. The initial substrate may be cleaned to provide a hydrogen-terminated surface to avoid potential surface state traps and trapped charges. The silicon substrate may undergo a final hydrofluoric (HF) rinse prior to ALD processing to provide the silicon substrate with a hydrogen-terminated surface without a native silicon oxide layer. Cleaning immediately preceding atomic layer deposition aids in reducing an occurrence of silicon oxide as an interface between the silicon based substrate and the dielectric formed using the atomic layer deposition process. The sequencing of the formation of the regions of the transistor being processed may follow the generally understood fabrication of a MOS transistor as is well known to those skilled in the art.

The dielectric covering the area on the substrate 302 between the source and drain diffused regions 304 and 306 may be deposited by ALD in this illustrative embodiment, and may comprise one or more barium titanate layers 310 and 314, each potentially formed of many individual deposition layers. There are shown sequentially interleaved barium zirconate layers 308, 312 and 316. Each of the shown layers may have any desired thickness to obtain desired work function and interface state density between the lowest layer 308 and the substrate, and to provide a desired final gate dielectric composition. Alternatively, there may be other combinations of interleaved and non-interleaved layers of varying thickness and deposition method. This laminated dielectric layer may be referred to as the gate oxide, and while shown as distinct layers for clarity, is a single alloyed layer, or substituted, or doped layer. There may be a diffusion barrier layer inserted between the first dielectric layer 308 and the substrate 302 to prevent metal contamination from affecting the electrical properties of the device. The illustrative embodiment shows the two dielectric layers 310 and 314 having the same thickness, however the desired dielectric properties of the nanolaminate film may be best achieved by adjusting the ratio of the thickness of the dielectric layers to different values. For example it may be desired to have the dielectric constant value change as the dielectric is close to the substrate 302 versus near the gate electrode 318. This may be known as a graded dielectric. The transistor 300 has a conductive material forming a gate electrode 318 in this illustrative embodiment, but the laminated (or nanolaminate if the individual layers are thin enough) dielectric may also be used in a floating gate device such as an EEPROM transistor, as either one or both of the floating gate dielectric and the control gate dielectric layers. The conductive material may be polysilicon or various metals.

As illustrative embodiments, the gate dielectric (layers 308-316) may be used as a simple transistor dielectric having a controllable and high dielectric constant, as a non volatile memory device, as a capacitor, or as a tunnel gate insulator and/or as a floating gate dielectric in a flash memory device. Use of dielectric layers containing a laminated atomic layer deposited dielectric layer for a gate dielectric and/or floating gate dielectric in which the dielectric layer contacts a conductive layer is not limited to silicon based substrates, but may be used with a variety of semiconductor substrates.

Figure 4:
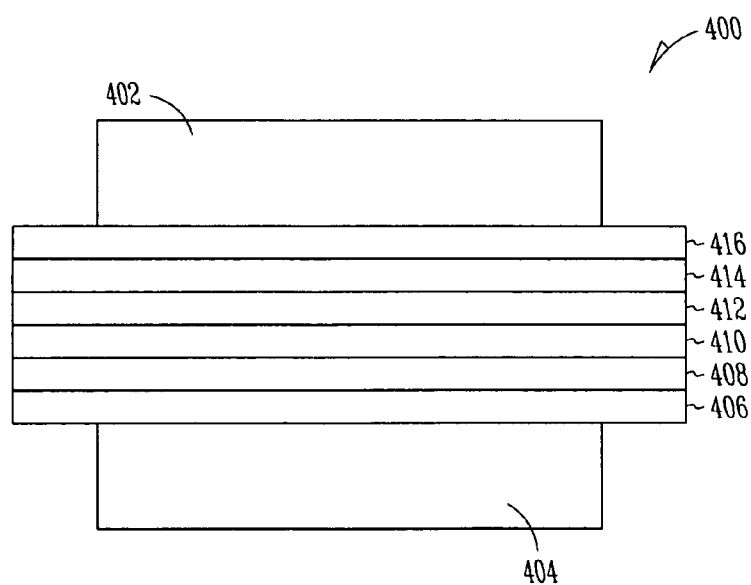
FIG. 4 shows an embodiment of a configuration of a capacitor having a dielectric layer containing an atomic layer deposited oxide, according to an embodiment.

Embodiments of methods for forming dielectric layers containing an ALD deposited dielectric layer contacting a conductive layer may also be applied to forming capacitors in various integrated circuits, memory devices, and electronic systems. In an embodiment including a capacitor 400 illustrated in FIG. 4, a method includes forming a first conductive layer 402, a second conductive layer 404, having a nanolaminate dielectric having interleaved layers 406-416 of two different materials, formed between the two conductive layers. The conductive layers 402 and 404 may include metals, doped polysilicon, silicided metals, polycides, or conductive organic compounds, without affecting the teachings of this disclosure. The sequencing and thickness of the individual layers may depend upon the application and may include a single layer of each material, one layer of one of the materials and multiple layers of the other, or other combinations of layers including different layer thicknesses. By selecting thickness and composition of each layer, a nanolaminate structure can be engineered to have a predetermined dielectric constant and composition. Although the material layers are shown in this illustrative example as being distinct layers, the oxide may be alloyed to form a single material layer. Structures such as the nanolaminate structure shown in FIGS. 3 and 4 may be used in non volatile single gate memories, two gate flash memory devices as well as other integrated circuits. Transistors, capacitors, and other devices having dielectric films may be implemented into memory devices and electronic systems including information handling devices. Embodiments of these information handling devices include wireless systems, telecommunication systems, computers and integrated circuits.

Figure 5:
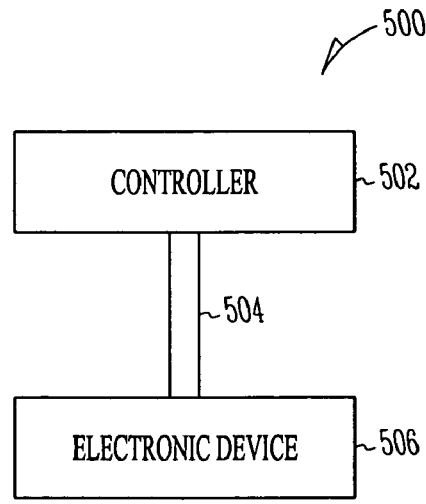
FIG. 5 is a simplified diagram for an embodiment of a controller coupled to an electronic device.

FIG. 5 illustrates a diagram for an electronic system 500 having one or more devices having a dielectric layer containing an atomic layer deposited insulator formed according to various embodiments of the present invention. Electronic system 500 includes a controller 502, a bus 504, and an electronic device 506, where bus 504 provides electrical conductivity between controller 502 and electronic device 506. In various embodiments, controller 502 and/or electronic device 506 include an embodiment for a dielectric layer containing sequentially deposited ALD layers as previously discussed herein. Electronic system 500 may include, but is not limited to, information handling devices, wireless systems, telecommunication systems, fiber optic systems, electro-optic systems, and computers.

Figure 6:
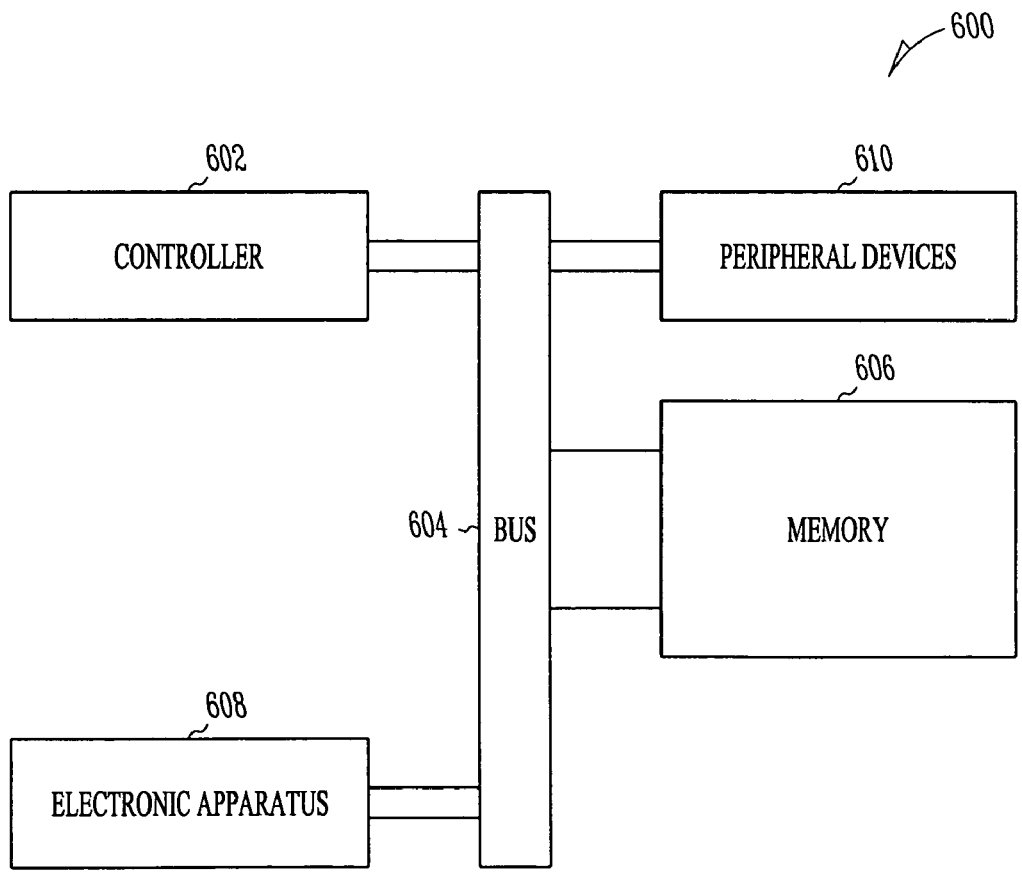
FIG. 6 illustrates a diagram for an embodiment of an electronic system having devices with a dielectric film containing an atomic layer deposited layered sequence of oxides, according to an embodiment.

FIG. 6 depicts a diagram of an embodiment of a system 600 having a controller 602 and a memory 606. Controller 602 and/or memory 606 include an ALD dielectric layer formed in accordance with the disclosure. System 600 also includes an electronic apparatus 608, and a bus 604, where bus 604 may provide electrical conductivity and data transmission between controller 602 and electronic apparatus 608, and between controller 602 and memory 606. Bus 604 may include an address, a data bus, and a control bus, each independently configured. Bus 604 also uses common conductive lines for providing address, data, and/or control, the use of which may be regulated by controller 602. In an embodiment, electronic apparatus 608 includes additional memory devices configured similarly to memory 606. An embodiment includes an additional peripheral device or devices 610 coupled to bus 604. In an embodiment controller 602 is a processor. Any of controller 602, memory 606, bus 604, electronic apparatus 608, and peripheral devices 610 may include a dielectric layer having an ALD deposited oxide layer in accordance with the disclosed embodiments.

System 600 may include, but is not limited to, information handling devices, telecommunication systems, and computers. Peripheral devices 610 may include displays, additional storage memory, or other control devices that may operate in conjunction with controller 602 and/or memory 606. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as other emerging DRAM technologies.

Thin films of ferroelectric materials have emerged in the last few decades as an important constituent of nonvolatile memory devices (NVRAMs), tunable dielectrics, infrared sensors, microelectromechanical systems (MEMs) and electro-optic modulators. Ferroelectric materials include spontaneous polarizers for memory devices, and relaxors having very high dielectric permittivity and high electro-strictive response and thus of interest in multi layer ceramic capacitors (MLCC) and micromechanical systems. By varying the percentage of barium titanate (referred to as either BT or $BaTiO_3$) and barium zirconate ($BaZrO_3$) the material may be controlled to act as either a standard ferroelectric material for use in a NVRAM, or as a relaxor for use in a MLCC or MEM.

Other material properties of the ferroelectric film may also be adjusted or optimized by varying the titanium to zirconium ratio. As the amount of zirconium is increased the Curie point of the material decreases and the spontaneous polarization decreases. This may be significant in the temperature stability of a NVRAM and the amount of electric charge that may be stored.

As the amount of zirconium approaches about 27%, the material becomes similar to the properties of relaxors, such as typical lead based materials used in MEM structures. The material may also become more amorphous, or at least having smaller polycrystalline grain size, perhaps due to the larger size of the zirconium atom as compared to the titanium atom inhibiting grain growth.

The dielectric constant of the material varies substantially with the percentage of zirconium, with barium titanate having a value of about 475, a 20% zirconium substituted layer having a value of about 400, 30% about 275 and 40% about 150. This is a large variation within a relatively small percentage change, and films formed by the methods of sputtering of a target, dual target co-sputtering, metal organic chemical vapor deposition (MOCVD), pulse laser deposition and chemical solution deposition (CSD), result in variations in thickness and layer composition producing large changes in device operating parameters as compared to the described use of ALD, which provides better uniformity and accuracy.

Thus, a reliable process for forming the dielectric layer must have desirably accurate control over the ratio of zirconium to titanium in the film, and improved control over the film thickness. Atomic layer deposition (ALD) provides both levels of film property control.

An embodiment for a method for forming an electronic device includes forming a dielectric layer by using an atomic layer deposition (ALD) technique to form a dielectric having zirconium substituted barium titanium oxide $Ba(Ti_{1-x}Zr_xO_3)$. Titanium is elemental metal number 22 and zirconium is element number 40, both in the IVA column of the periodic chart. Barium is element number 56 in column IIA of the periodic chart. Zirconium substituted films may be formed by first forming a single molecule thick barium titanate film, followed by forming a single molecule thick barium zirconate film, thus producing a barium film with approximately a 50% zirconium, 50% titanium content, i.e., a 1/1 ratio. By adjusting the number of barium titanate layers between each single barium zirconate layer, the ratio of zirconium to titanium in the final $Ba(T_{1-x}Zr_xO_3)$ film may be easily and repeatably controlled within the useful range of X from zero to 0.40, which may represent the amount of zirconium versus titanium in the film.

There are many alternative methods of forming the final $Ba(Ti_{1-x}Zr_xO_3)$ film. Thin layers of titanium oxide films, layered with thin layers of barium oxide and zirconium oxide may be annealed to form a substantially single film of zirconium substituted barium titanate. For example titanium dioxide, $TiO_2$, or zirconium dioxide $ZrO_2$, may be atomic layer deposited using various precursors such as titanium tetrachloride $TiCl_4$ (or respectively zirconium tetrachloride $ZrCl_4$) and water vapor ($H_2O$) at a temperature of from 100 to 250° C., more typically 160° C. An alternative titanium or zirconium precursor is tetrakis diethyl amino titanium (TDEAT), or zirconium (TDEAZ). Yet another zirconium precursor is zirconium tertiary-butoxide [$Zr(t-OC_4H_9)_4$] also known as ZTB, which has a higher vapor pressure and thus evaporates more easily. Alternative oxidizing precursors or reactants may include hydrogen peroxide, nitrous oxide and oxygen.

Barium titanate layers may be formed using ALD with reactants like barium cyclopentadienyl compounds. One example is barium bis(pentamethylcyclopentadienyl) mixed with titanium tetra isoproxide and water at around 275° C. Various other types of precursors may be used, such as volatile diketonate chelates (for example 2,2,6,6-tetramethyl-3,5-heptanedione). In many of these cases the titanium precursor may have a selected proportion of a chemically similar zirconium precursor added, so that the single thin layer deposited in a single deposition iteration may have the complete formula $Ba(Ti_{1-x}Zr_xO_3)$. In this example there would be no need for an anneal to create a single thick layer out of the multiple interleaved deposition steps, as may be required if the layer is formed of different interleaved material layers.

Each of these films may have a very tightly controlled thickness for each deposition cycle that depends on the saturation of the substrate surface. The surface of the ALD formed is also very smooth and continuous, even over sharp underlying topography. The deposition cycles may also be alternated between the two different materials, and the resulting film may either be a nanolaminate of the two or more different oxides, or the oxides may form an alloy with each other if the similarity between the two metals results in miscible materials, as is the case with barium titanate and barium zirconate. In either case the film properties may vary depending upon the ratio of the two or more different materials, and thus materials may be formed that have engineered properties.

The low temperature deposition results in films that are amorphous even after subsequent heat cycles such as densification and mild oxidative repair cycles. Silicon dioxide layers grown by oxidation of silicon substrates are amorphous, and the subsequent heat cycles typically used in semiconductor fabrication do not substantially change the amorphous nature of the silicon dioxide. This may be important since crystallization of a dielectric may cause the surface to become rough, which may cause greatly increased leakage across the dielectric. The crystallization of a dielectric may also cause the covering conductive layer to form sharp spikes, which may increase the local electric field to a level that may cause dielectric breakdown and result in a short circuit. This may be another benefit of the use of ALD in comparison to other deposition methods.

The atomic layer deposition may have an activated substrate surface at a preselected temperature exposed to a titanium-containing first precursor material for a first time period and flow volume, which saturates the substrate surface. Then a first purge for a second time period removes substantially all non-adsorbed portions of the first precursor material, or combination of materials from the substrate surface. Then the substrate surface is exposed to a first oxidizing reactant material which reacts with the adsorbed first precursor material on the substrate surface to form a first material layer (such as barium titanate) to complete a first deposition cycle. The deposition cycle is repeated until a desired first material thickness is obtained, and the substrate surface is exposed to a second precursor material, or combination of materials, to saturate the substrate surface with the second precursor material, which is repeated to obtain the second material thickness.

Embodiments include structures for capacitors, transistors, memory devices, and electronic systems with dielectric layers containing an atomic layer deposited dielectric, and methods for forming such structures. These and other aspects, embodiments, advantages, and features will become apparent from the following description and the referenced drawings.

Formation of oxide layers by an ALD deposition may form substituted dielectric films at relatively low temperatures, such as 250° C., may be amorphous, have tighter thickness and compositional control, and possess smooth surfaces, as compared to sputtered films. Such oxide films may provide enhanced electrical properties as compared to physical deposition methods, or typical chemical layer depositions, due to their smoother surface, and reduced damage, resulting in reduced leakage current. Additionally, such ferroelectric layers provide a thicker physical thickness than a silicon oxide layer having the same equivalent oxide thickness, where the increased thickness may reduce leakage currents. The properties of ALD deposited dielectric layers allow applications as dielectric layers in electronic devices and systems, MEMs, and non volatile memories. ALD zirconium substituted barium titanates as gate oxides have a dielectric constant (k) substantially higher than that of silicon oxide, such that these dielectric films possess an equivalent thickness, $t_{eq}$, thinner than $SiO_2$ gate dielectrics of the same physical thickness. Films having relatively large physical thickness improve the electrical properties of the dielectrics.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiments of the above structures and fabrication methods are used. The scope of the embodiments of the present invention should be determined with reference to the appended claims, along with the full scope of equivalents to which such claims are entitled.

What is claimed is:

1. A capacitor, comprising:
   a first conductive layer;
   a ferroelectric layer disposed on the first conductive layer, the ferroelectric layer comprising a nanolaminate, the nanolaminate containing a zirconium substituted barium titanate film having a zirconium to titanium ratio of from 10 to 40 atomic percent, wherein the nanolaminate includes a layer essentially of barium oxide in addition to the layer of zirconium substituted barium titanate; and
   a second conductive layer disposed on the dielectric layer.

2. The capacitor of claim 1, wherein the zirconium substituted barium titanate film has a root mean square surface roughness of less than 10 angstroms and a current leakage rate of less than $2 \times 10^{-7}$ amps per $cm^2$ at an electric field strength of 1 megavolt per cm.

3. The capacitor of claim 1, wherein the ferroelectric layer has an equivalent oxide thickness of less than 10 Angstroms, a dielectric constant of more than 250, and a breakdown voltage of greater than 2.5 MV/cm.

4. The electronic device of claim 1, wherein at least one of the first conductive layer or the second conductive layer includes a silicided metal.

5. The electronic device of claim 1, wherein at least one of the first conductive layer or the second conductive layer includes a conductive organic compound.

6. An electronic device comprising:
   a dielectric including a nanolaminate, the nanolaminate containing a layer of zirconium substituted barium titanate in an integrated circuit and the nanolaminate containing a layer essentially of barium oxide in addition to the layer of zirconium substituted barium titanate; and
   a conductive layer contacting the dielectric.

7. The electronic device of claim 6, wherein a zirconium to titanium ratio ranges from 10 to 20 atomic percent, and the dielectric having a dielectric constant greater than 250.

8. The electronic device of claim 6, wherein the electronic device includes a non volatile memory element having the dielectric as a gate insulator in a transistor device.

9. The electronic device of claim 6, wherein the electronic device includes a CMOS transistor in the integrated circuit.

10. The electronic device of claim 6, wherein the electronic device includes a capacitor having the dielectric as a dielectric material between at least two of a plurality of electrodes in the capacitor.

11. The electronic device of claim 6, wherein the nanolaminate includes a layer essentially of barium titanate in addition to the layer of zirconium substituted barium titanate.

12. The electronic device of claim 6, wherein the nanolaminate includes a layer essentially of barium zirconate in addition to the layer of zirconium substituted barium titanate.

13. The electronic device of claim 6, wherein the nanolaminate includes a layer essentially of titanium oxide in addition to the layer of zirconium substituted barium titanate.

14. The electronic device of claim 6, wherein the conductive layer includes a doped polysilicon gate or a metallic gate.

15. The electronic device of claim 6, wherein the conductive layer includes a conductive organic compound.

16. An electronic system comprising:
   a controller;
   an electronic device coupled to the controller, wherein the electronic device includes:
      a dielectric including a nanolaminate, the nanolaminate containing a layer of zirconium substituted barium titanate in an integrated circuit and the nanolaminate containing a layer essentially of barium oxide in addition to the layer of zirconium substituted barium titanate, where the zirconium to titanium ratio is from 10 to 30 atomic percent and the layer of zirconium substituted barium titanate has a dielectric constant of from 250 to 500; and
      a conductive layer contacting the dielectric layer.

17. The electronic system of claim 16, wherein the electronic device includes a memory.

18. The electronic system of claim 16, wherein the electronic device includes a non-volatile memory.

* * * * *